(12) United States Patent
Chaudhury et al.

(10) Patent No.: US 6,793,759 B2
(45) Date of Patent: Sep. 21, 2004

(54) METHOD FOR CREATING ADHESION DURING FABRICATION OF ELECTRONIC DEVICES

(75) Inventors: Manoj Kumar Chaudhury, Bethlehem, PA (US); Andrew James Goodwin, Cardiff (GB); Yeong Joo Lee, Midland, MI (US); Bhukandas Parbhoo, Sully Penarth (GB)

(73) Assignee: Dow Corning Corporation, Midland, MI (US)

( * ) Notice: Subject to any disclaimer, the term of this patent is extended or adjusted under 35 U.S.C. 154(b) by 299 days.

(21) Appl. No.: 09/973,498

(22) Filed: Oct. 9, 2001

(65) Prior Publication Data

US 2003/0145940 A1 Aug. 7, 2003

(51) Int. Cl.[7] .............................................. B32B 31/12
(52) U.S. Cl. ..................... 156/272.6; 427/536; 427/569
(58) Field of Search .......................... 156/272.2, 272.6; 427/535, 536, 562, 569; 438/474, 475, 513, 798

(56) References Cited

U.S. PATENT DOCUMENTS

| | | | |
|---|---|---|---|
| 3,629,084 A | 12/1971 | Soldatos ..................... 204/168 |
| 4,639,285 A | 1/1987 | Suzuki et al. ............ 156/272.6 |
| 4,753,978 A | 6/1988 | Jensen ........................ 524/862 |
| 4,766,176 A | 8/1988 | Lee et al. ................... 525/100 |
| 4,868,096 A | 9/1989 | Nakayama et al. ......... 430/329 |
| 4,897,153 A | 1/1990 | Cole et al. .................. 156/643 |
| 4,933,060 A | 6/1990 | Prohaska et al. ...... 204/192.36 |
| 5,017,654 A | 5/1991 | Togashi et al. ............. 525/100 |
| 5,019,210 A | * 5/1991 | Chou et al. ............... 156/272.6 |
| 5,110,845 A | 5/1992 | Gray et al. ................. 523/211 |
| 5,148,266 A | 9/1992 | Khandros et al. ............. 357/80 |
| 5,344,467 A | 9/1994 | Huang et al. ................. 44/358 |
| 5,346,861 A | 9/1994 | Khandros et al. ........... 437/209 |
| 5,347,159 A | 9/1994 | Khandros et al. ........... 257/692 |
| 5,357,005 A | 10/1994 | Buchwalter et al. ........ 525/436 |
| 5,477,611 A | 12/1995 | Sweis et al. ................... 29/840 |
| 5,497,033 A | 3/1996 | Fillion et al. ............... 257/723 |
| 5,848,467 A | 12/1998 | Khandros et al. ............. 29/841 |
| 5,858,815 A | 1/1999 | Heo et al. ................... 438/112 |
| 5,977,226 A | 11/1999 | Dent et al. .................. 524/267 |
| 5,990,545 A | 11/1999 | Schueller et al. ........... 257/697 |
| 6,074,895 A | * 6/2000 | Dery et al. .................. 438/108 |
| 6,130,112 A | 10/2000 | Kitano et al. ............... 438/108 |
| 6,602,803 B2 | * 8/2003 | Yew et al. ................... 438/780 |

FOREIGN PATENT DOCUMENTS

| | | |
|---|---|---|
| EP | 0 391 068 | 3/1990 |
| EP | 0 430 476 | 11/1990 |
| EP | WO 01/61743 A1 | 8/2001 |
| EP | WO 02/13247 A1 | 2/2002 |
| JP | 06-346034 | 12/1994 |
| JP | 08-153833 | 6/1996 |
| JP | 08-335608 | 12/1996 |
| JP | 09-214140 | 8/1997 |
| JP | 11-277699 | 10/1999 |
| JP | 2000-73029 | 3/2000 |
| JP | 2002-026123 A | 1/2002 |

OTHER PUBLICATIONS

University of California, Los Angeles, Electronic Materials, Eli Yablonovitch, vol. 9, pp. 219–229.

Analytical Chemistry, David C. Duffy, et. al., "Rapid Prototyping of Microfluidic Systems in Poly(dimethylsiloxane)" vol. 70, No. 23, Dec. 1, 1998.

American Chemical Society, "Rate–Dependent Fracture at Adhesive Interface", Manoj K. Chaudhury, May 26, 1999, pp. 6562–6566.

Adhesion '99, Seventh International Conference on Adhesion and Adhesives, Churchill College, Cambridge, UK, Sep. 15–17, 1999, "Adhesion Measurement of Silicone Thin Films," Bhukan Parbhoo and Manoj K. Chaudhury, pp. 350–356.

Langmuir, "Direct Measurement of Interfacial Interactions between Semispherical Lenses and Flat Sheets of Poly(dimethylsiloxane) and Their Chemical Derivatives" Manoj K. Chaudhury and George M. Whitesides, 1991, vol. 7, pp. 1013–1025.

2002 Electronic Components and Technology Conference, "Surface Activated Bonding for New Flip Chip and Bumpless Interconnect System", Tadatomo Suga, et. al., Institute for Advanced Micro–system Integration (IMSI), The University of Tokyo, RCAST, Toray Engineering Co. Ltd., 7 pages.

* cited by examiner

Primary Examiner—Jeff H. Aftergut
Assistant Examiner—John T. Haran
(74) Attorney, Agent, or Firm—Catherine U. Brown

(57) ABSTRACT

A method for creating adhesion includes plasma treating two substrates and thereafter contacting the substrates. The method can be used on a variety of dry surfaces. The method is used to adhere nonadhesive surfaces such as a cured silicone with a ceramic or semiconductor.

31 Claims, No Drawings

METHOD FOR CREATING ADHESION DURING FABRICATION OF ELECTRONIC DEVICES

FIELD OF THE INVENTION

This invention relates to a method for creating adhesion of materials that do not ordinarily exhibit adherent properties. The materials include a polymeric material and a substrate. The polymeric material can be used to connect two components of an electronic device together, such as an integrated circuit chip and a chip carrier.

BACKGROUND

Polymers have found applications in a wide range of technologies but not all polymer materials possess the required physical and chemical properties for good adhesion. Plasma treatment is one means of modifying polymer surfaces to improve adhesion while maintaining the desirable properties of the bulk material.

Adhesion of polymeric materials to similar materials can be improved by plasma, corona, dielectric discharge barrier, or flame treatment with or without assistance of a subsequent thermal treatment during joining process. Examples are films of polyethyleneterephthalate or polyethylene that were bonded to themselves or to each other by lamination under heat and pressure treatment. The mechanisms of adhesion were of the physisorption nature of London dispersion forces and hydrogen bonds. These adhesive joints are susceptible to the effect of external agents such as water or organic solvents and durability can be poor. Other systems related to plasma-treated surfaces, have been focused on surface chemistry changes after plasma treatment of less wettable surfaces such as poly vinyl chloride and polymer fabrics.

One method for improving adhesion is plasma treatment of a substrate, applying a wet or adhesive formulation in an uncured state to the treated surface, and thereafter curing the formulation. For example, one method for bonding two layers of siloxane-polyimide polymers includes bonding by etching (or cleaning) the first layer by using plasma before applying the second layer by spin coating. This method suffers from the drawback of not providing dry adhesion. Plasma treatment is used as an alternative method of surface treating a substrate in a similar manner as a chemical treatment like a hydrochloric or sulfo chromic acid solution. Surface chemical treatment has also been proposed for improved bonding. Treating cured silicone rubber with bromine water etches the low energy surface to produce a high energy surface to which various curable polymeric systems may be directly cured on and bonded. This process has many disadvantages related to handling and disposal of dangerous and toxic chemicals.

Methods for improving adhesion using plasma treatment in electronics applications have been disclosed. For example, one method for improving adhesion between an encapsulant and an IC chip, and between the encapsulant and the chip carrier, employs plasma treatment of either the IC chip or the chip carrier. Another method employs plasma surface modification of a thermoplastic substrate to improve adhesion to an addition curable silicone adhesive. These are both wet applications (i.e., an uncured encapsulant composition is applied to the plasma-modified surface and then cured). Another method discloses that corona or plasma treatment of a tackifier layer in a liquid crystal display improves adhesion between the tackifier and the polarizing sheet or the phase shift sheet. However, none of these methods create adhesion between nonadhesive surfaces.

Plasma surface treatment has also been used in metal deposition or lamination. One method discloses that plasma treatment of fluoro-polymers can improve metal deposition by thermal evaporation, electroless deposition or thermal beam evaporation. Another method discloses that a laminate composed of an insulated base film of a synthetic resin, a metal foil and a silicone adhesive layer, can be made by applying plasma surface treatment of the base film prior to adhesive bonding. These methods suffer from the drawback of not creating adhesion between two dry surfaces by using plasma.

SUMMARY OF THE INVENTION

This invention relates to a method for creating adhesion. The method can be used during fabrication of an electronic device or an electronic device package. The method comprises:

a) plasma treatment of a polymeric material, b) plasma treatment of an adherend, and c) thereafter contacting the polymeric material and the adherend; thereby creating adhesion of the polymeric material and the adherend.

DETAILED DESCRIPTION OF THE PREFERRED EMBODIMENTS

All amounts, ratios, and percentages are by weight unless otherwise indicated. The following is a list of definitions, as used herein.

Definitions

"A" and "an" each mean one or more.

"Combination" means two or more items put together by any means or method.

"Cured" means substantial completion of a chemical process by which molecules are joined together by crosslinking into larger molecules to restrict molecular movements.

"Nonadhesive" means that a polymeric material would not normally adhere to a substrate without treatment.

"Plasma treatment" means exposing a substrate to a gaseous state activated by a form of energy externally applied and includes, but is not limited to, corona discharge, dielectric barrier discharge, flame, low pressure glow discharge, and atmospheric glow discharge treatment. The gas used in plasma treatment can be air, ammonia, argon, carbon dioxide, carbon monoxide, helium, hydrogen, krypton, neon, nitrogen, nitrous oxide, oxygen, ozone, water vapor, combinations thereof, and others. Alternatively, other more reactive gases or vapors can be used, either in their normal state of gases at the process application pressure or vaporized with a suitable device from otherwise liquid states, such as hexamethyldisiloxane, cyclopolydimethylsiloxane, cyclopolyhydrogenmethylsiloxanes, cyclopolyhydrogenmethyl-co-dimethylsiloxanes, reactive silanes, combinations thereof, and others.

Methods

This invention relates to a method for creating adhesion of a polymeric material and a substrate. The method can be used during fabrication of electronic devices and electronic device packages. In one embodiment of the invention, the method comprises:

a) plasma treatment of a polymeric material, b) plasma treatment of a substrate, c) plasma treatment of a semiconductor, d) contacting the polymeric material and the substrate, and e) contacting the semiconductor and the polymeric material.

In one embodiment of the invention, steps a, b, c, d, and e can be carried out in any of the following orders: abcde, acbde, abced, acbed, bacde, baced, bcade, bcaed, cabde, cabed, cbade, cbaed, abdce, badce, acebd, caebd, abdace, badace, abdcae, badcae, aceabd, caeabd, acebad, or caebad. One skilled in the art would recognize that when a semiconductor and a substrate are both bonded to the polymeric material, plasma treatment of the polymeric material may be carried out more than once, i.e. step a may be repeated. For example, in one embodiment, plasma treatment is carried out on the polymeric material and the substrate, and the polymeric material and the substrate are contacted. Plasma treatment is then carried out separately on the semiconductor and on a different surface of the polymeric material than that contacted with the substrate. The polymeric material and the substrate are then contacted. Plasma treatment can be carried out on all or a portion of the surface of the polymeric material, the substrate, or the semiconductor.

Alternatively, steps a, b, and c can be carried out concurrently and thereafter steps d and e are carried out in any order. Alternatively, steps a, b, and c are carried out in any order, and thereafter steps d and e are carried out concurrently. Alternatively, steps a, b, and c are carried out concurrently, and thereafter steps d and e are carried out concurrently.

In one embodiment of the invention, the polymeric material is contacted with the substrate and optionally the semiconductor as soon as practicable after plasma treatment. In an alternative embodiment, the polymeric material, the substrate, and optionally the semiconductor may optionally each be stored independently before contacting in step d, step e, or both. In one embodiment of this invention, the polymeric material can be stored for at least about 0, alternatively at least about 1, alternatively at least about 2 hours after plasma treatment. The polymeric material can be stored for up to about 48, alternatively up to about 24, alternatively up to about 8, alternatively up to about 4 hours after plasma treatment. The same storage conditions can be used independently for the substrate and the semiconductor.

In one embodiment of this invention, adhesion can be obtained by carrying out steps d and e for a few seconds at about room temperature. In an alternative embodiment of the invention, step d, step e, or both, are carried out at elevated temperature, elevated pressure, or both. The exact conditions selected for step d, step e, or both, will depend on various factors including the specific use of the method. However, temperature during the contacting steps can be at least about 15° C., alternatively at least about 20° C., alternatively at least about 100° C. Temperature during contacting can be up to about 400° C., alternatively up to about 220° C. Pressure during contacting can be up to about 10 megaPascals, alternatively up to about 1 megaPascal. Pressure during contacting is at least about 0.1 megaPascal. Contact time can be at least about 0.1 second, alternatively at least about 1 second, alternatively at least about 5 seconds, alternatively at least about 20 seconds. Contact time can be up to about 24 hours, alternatively up to about 12 hours, alternatively up to about 30 minutes, alternatively up to about 30 seconds.

In an alternative embodiment of the invention, the method comprises:

A) plasma treatment of a polymeric material,

B) plasma treatment of an adherend, and

C) thereafter contacting the polymeric material and the adherend; thereby creating adhesion of the polymeric material and the adherend.

In this embodiment, the adherend can be either a semiconductor or a substrate. In this embodiment, the method may optionally further comprise: storing the polymeric material after step A) and before step C), or storing the adherend after step B) and before step C), or both.

Steps A) and B) may be carried out in any order, and the same plasma treatment conditions, contact conditions, and optional storage conditions as above may be applied.

In this embodiment, steps A) and B) can be carried out concurrently or sequentially in any order. In this embodiment, steps A), B), and C) may optionally be repeated one or more times. This method can be used during fabrication of an electronic device or an electronic device package, or this method can be used more broadly for other purposes. Use of this method is not specifically restricted.

The method of this invention creates adhesion, e.g., the adherend does not fall off the polymeric material when subjected to about 0.1 megaPascal of force in the die shear strength test of Reference Example 5, below. The exact amount of adhesion will vary depending on the polymeric material and adherend chosen, the plasma treatment conditions chosen, and the contacting conditions chosen. However, adhesion, as measured by die shear strength according to Reference Example 6, below, can be at least about 0.2 megaPascal (Mpa), alternatively at least about 0.3 MPa, alternatively at least about 0.5 MPa, alternatively at least about 1 MPa, alternatively at least about 1.5 MPa, alternatively at least about 2 MPa, alternatively at least about 2.5 MPa, alternatively at least about 5 MPa.

Polymeric Material

The polymeric material used in this invention is nonadhesive when used in this method, e.g., immediately before plasma treatment. The polymeric material has a relatively low modulus (e.g., lower modulus than the substrate or semiconductor). The modulus will vary depending on various factors including the exact polymeric material chosen, the adherend to which the polymeric material will be adhered, and others. However, modulus can be at least about 0.1 megaPascal, alternatively at least about 1 megaPascal. Modulus can be up to about 300 megaPascals, alternatively up to about 400 megaPascals, alternatively up to about 1 gigaPascal, alternatively up to about 5 gigaPascals.

In one embodiment of the invention, the polymeric material is a thermoset or a thermoplastic material. The polymeric material can be a silicone, an organic, a silicone-organic copolymer, or combinations thereof. Thermoset materials include flexibilized epoxies, which are organic, and elastomers which can be silicones, organics, or silicone organic-copolymers. Thermoplastic materials include phase change materials such as silicone-organic copolymer waxes and organic materials such as polyolefins (e.g., polyethylene), polyimides, phenolics, combinations thereof, and others.

In one embodiment of the invention, the polymeric material is a cured silicone, such as a cured silicone resin, a cured silicone elastomer, a cured silicone rubber, combinations thereof, and others. Suitable cured silicone resins include T, DT, MT, MQ resins, combinations thereof, and others.

Cured silicone rubbers and methods for their fabrication are known in the art, see for example, W. Lynch, *Handbook of Silicone Rubber Fabrication*, Van Nostrand Reinhold Company, New York, 1978. Cured silicone elastomers are known in the art. For example, U.S. Pat. Nos. 4,753,978 and 5,110,845 disclose cured silicone elastomers and methods for their preparation.

The cured silicone can be prepared by curing a curable silicone composition. Curable silicone compositions are known in the art. Examples of curable silicone compositions and methods for their cure include the compositions set forth and described in U.S. Pat. Nos. 4,766,176; 5,017,654; and 5,977,226. The cured silicone can be prepared from a silicone composition formulated with an adhesion promoter, however, an adhesion promoter is not required.

It should be noted by those skilled in the art that the mode of cure of the compositions is not critical, and can include cure mechanisms such as condensation reactions; addition reactions; ultraviolet radiation initiated reactions, and free radical initiated reactions.

In an alternative embodiment of the invention, the polymeric material is a cured organic such as a cured organic resin, a cured organic elastomer, a cured organic polymer, combinations thereof, and others. Suitable cured organic resins include cured epoxy resins. Suitable cured organic elastomers include polyurethane. Suitable cured organic polymers include epoxy, polyimide, polyimide copolymers, combinations thereof, and others. Suitable cured organic polymers are known in the art, see for example, "Chip Scale Packaging for Memory Devices," Y. Akiyama, A. Nishimura, I. Anjoh and A. Nagai, IEEE Electronic Components and Technology Conference, 1999.

Suitable silicone-organic copolymers include silarylene, Lead-on-Chip (LOC) tape using polydimethylsiloxane-modified polyimide or polyamide. Silicone-organic copolymers are known in the art, see for example, "Advances in Materials Research in Japan," Phase IV, *Report 2. Polymer materials for Advanced Microelectronics Technology*, June 2000, Techno Alliance Corporation, Tokyo, Japan.

Polymeric materials that are cured can be used in this invention. In contrast to methods that use wet (uncured) or partially-cured (e.g., B-staged) materials, this method can create adhesion of cured silicones, cured organics, and cured silicone-organic copolymers to various adherends.

The polymeric material can have a variety of forms. The polymeric material may be continuous, such as a sheet or film. Alternatively, the polymeric material may be discontinuous, such as a plurality of flat pads or hemispherical nubbins or bumps.

Substrate

The substrate used in this method is not specifically restricted. The substrate selected will depend on the various factors including the use of the method described above, e.g., the type of electronic device or electronic device package to be fabricated. The substrate can be any material used in the fabrication of an electronic device or an electronic device package. The substrate can be, for example a ceramic substrate, a flexible substrate, or a rigid substrate commonly used in electronic device packaging. Examples of suitable substrates include a ceramic, a metal, a metal-coated surface, a polymer (i.e., other than the polymeric material described above), combinations thereof, and others.

Metals and metal coatings include aluminum, chromium, copper, gold, lead, nickel, platinum, solder, stainless steel, tin, titanium, alloys thereof, combinations thereof, and others.

Ceramics include aluminum nitride, aluminum oxide, silicon carbide, silicon oxide, silicon oxynitride, combinations thereof, and others; alternatively aluminum nitride, aluminum oxide, silicon carbide, silicon oxynitride, and combinations thereof.

Polymers include benzocyclobutene, bismaleimide, cyanate, epoxy, polybenzoxazole, polycarbonate, polyimide, polymethylmethacrylate, polyphenylene ether, polyvinylidene chloride, combinations thereof, and others.

Semiconductor

Semiconductors are known in the art and commercially available, for example, see J. Kroschwitz, ed., "Electronic Materials," *Kirk-Othmer Encyclopedia of Chemical Technology*, 4$^{th}$ ed., vol. 9, pp. 219–229, John Wiley & Sons, New York, 1994. Common semiconductors include silicon, silicon alloys, and gallium arsenide. The semiconductor can have any convenient form, such as a bare die, a chip such as an IC chip, or a wafer.

Plasma Treatment

Plasma treatment of a nonadhesive material converts the surface properties of the nonadhesive material from being nonadhesive to adhesive. Various types of plasma treatment can be used in the method of this invention, including corona discharge treatment, dielectric barrier discharge treatment, and glow discharge treatment. Glow discharge treatment can be carried out using plasma selected from low pressure glow discharge or atmospheric pressure glow discharge.

In one embodiment of the invention, plasma treatment is carried out by low pressure glow discharge plasma in either continuous or pulsed modes. This is essentially a batch process. Alternatively, plasma treatment can be performed at atmospheric pressure in a continuous process using appropriate atmospheric plasma apparatuses. Other plasma treatments can also be used. One skilled in the art would be able to select appropriate plasma treatments without undue experimentation. Plasma treatments are known in the art. For example, U.S. Pat. Nos. 4,933,060 and 5,357,005 and T. S. Sudarshan, ed., *Surface Modification Technologies An Engineer's Guide*, Marcel Dekker, Inc., New York, 1989, Chapter 5, pp. 318–332 and 345–362, disclose plasma treatments.

The exact conditions for plasma treatment will vary depending on various factors including the choice of polymeric material, substrate, and semiconductor; the storage time between plasma treatment and contacting; the type and method of plasma treatment used; design of the plasma chamber used; and others. However, plasma treatment can be carried out at a pressure of up to about atmospheric pressure. Plasma treatment can be carried out at a pressure of at least about 0.05 torr, alternatively at least about 0.78 torr, alternatively at least about 1.5 torr. Plasma treatment can be carried out at a pressure of up to about 10 torr, alternatively up to about 3 torr. If pressure is too high, plasma treatment may not initiate.

Time of plasma treatment depends on various factors including the material to be treated, the contact conditions selected, the mode of plasma treatment (e.g., batch vs. continuous), and the design of the plasma apparatus. Plasma treatment is carried out for a time sufficient to render the surface of the material to be treated sufficiently reactive to form an adhesive bond. Plasma treatment is carried out for a time of at least about 1 millisecond, alternatively at least about 0.002 second, alternatively at least about 0.1 second, alternatively at least about 1 second, alternatively at least about 5 seconds. Plasma treatment is carried out for up to about 30 minutes, alternatively up to about 1 minute, alternatively up to about 30 seconds. It may be desirable to minimize plasma treatment time for commercial scale process efficiency. Treatment times that are too long may render some treated materials nonadhesive or less adhesive.

The gas used in plasma treatment can be, for example, air, ammonia, argon, carbon dioxide, carbon monoxide, helium, hydrogen, nitrogen, nitrous oxide, oxygen, ozone, water vapor, combinations thereof, and others. Alternatively, the gas can be selected from air, argon, carbon dioxide, carbon monoxide, helium, nitrogen, nitrous oxide, ozone, water vapor, and combinations thereof. Alternatively, the gas can be selected from air, argon, carbon dioxide, helium, nitrogen, ozone, and combinations thereof. Alternatively, other more reactive organic gases or vapors can be used, either in their normal state of gases at the process application pressure or vaporized with a suitable device from otherwise liquid states, such as hexamethyldisiloxane, cyclopolydimethylsiloxane, cyclopolyhydrogenmethylsiloxanes, cyclopolyhydrogenmethyl-co-dimethylsiloxanes, reactive silanes, combinations thereof, and others.

One skilled in the art would be able to select appropriate plasma treatment conditions without undue experimentation using the above guidelines and the examples set forth below.

Methods of Use

The method described above can be used to prepare adhesive bonds that resist either thermal treatment in absence or presence of water in the form of vapor or liquid, or mechanical stress. The adhesion property can be used to hold dissimilar parts together, that might otherwise require adhesive technologies applied in multiple steps.

The method can also be used during fabrication of electronic devices and electronic device packages. Electronic devices and methods for their fabrication are known in the art. For example, the electronic device can be a chip on board (COB), wherein the semiconductor is an IC chip, which is mounted directly on a substrate, such as a printed wiring board (PWB) or printed circuit board (PCB). COBs and methods for their fabrication are known in the art, for example, see *Basic Integrated Circuit Technology Reference Manual*, R. D. Skinner, ed., Integrated Circuit Engineering Corporation, Scottsdale, Ariz., Chapter 3.

In one embodiment of this invention, the method can be used in fabricating any electronic device package in which a semiconductor such as an IC chip is attached to a substrate such as a chip carrier. For example, the method can be used to bond the chip carrier to a polymeric material, thereby forming an interposer. The method can also be used to bond the IC chip to the polymeric material either before or after the polymeric material is bonded to the chip carrier. Alternatively, the method can be used to bond the IC chip to the polymeric material only, and an alternative method can be used to bond the polymeric material to the chip carrier. For example, an uncured material can be applied to a chip carrier by conventional means such as stencil or screen printing, spin coating, and others. The uncured material can then be cured to form a polymeric material. The polymeric material and IC chip may then be bonded by the method of this invention.

In an alternative embodiment of this invention, the method can be used on a polymeric material in the form of a flat pad, tape, film, or the like. For example, a composition can be cured to form the polymeric material. Thereafter, the polymeric material and an adherend are plasma treated and contacted according to the method described above.

Electronic device packages and methods for their fabrication are known in the art. For example, the method described above can be used in the fabrication of area array packages and leadframe packages. Area array packages include ball grid arrays, pin grid arrays, chip scale packages, and others. Leadframe packages include chip scale packages and others. Area array packages and leadframe packages, and methods for their fabrication, are known in the art, for example, see U.S. Pat. No. 5,858,815.

The method described above can be used in the fabrication of chip scale packages. Chip scale packages, and methods for their fabrication, are known in the art, for example, see U.S. Pat. No. 5,858,815.

This invention can be used in the fabrication of single chip modules (SCM), multichip modules (MCM), or stacked chip modules. SCM, MCM, and stacked chip modules, and methods for their fabrication, are known in the art, see, for example, *Basic Integrated Circuit Technology Reference Manual*, R. D. Skinner, ed., Integrated Circuit Engineering Corporation, Scottsdale, Ariz., Chapter 3.

The method described above can also be used in wafer-level packaging methods. This invention will be exemplified by reference to its use in wafer-level packaging methods. One wafer-level packaging method comprises the following steps.

Adhering a die attach material (polymeric material) to a substrate such as a tape used in tape automated bonding (TAB) or a PCB. The die attach material can be adhered to the substrate using the method described above. The method employs cured die attach materials in the fabrication process instead of uncured materials and allows confinement of the die attach materials to exactly defined and targeted positions. Converted tapes where a silicone elastomer is applied by the method of this invention can be made and supplied to assembler for ease of manufacturing, since the assembler does not need to deal with a wet (uncured) die attach adhesive, and adhesion can be created on demand.

Alternatively, the die attach material can be adhered to the substrate by conventional methods. Such conventional methods include applying an uncured die attach material to the substrate and thereafter curing the uncured die attach material. The uncured die attach material can be applied by, for example, a printing method, a dam and fill method, or a spin coating method. The substrate with the die attach material attached is hereinafter referred to as a converted substrate.

Bond windows can be fabricated in the converted tape by, for example, punching, sawing, or laser cutting. Center-bond or edge-bonds can be applied.

A semiconductor in the form of a wafer is then attached to the die attach material using the method described above.

The wafer can be wire bonded by conventional means using, for example, a conventional wire bonder or gang wire-bond. Optional plasma cleaning may be carried out before each wire bond.

After wire bonding, encapsulation to protect the wires is carried out. Plasma cleaning may optionally be carried out prior to encapsulation. Typically, an uncured encapsulant is dispensed, injection molded, or printed and then cured.

Optionally, a protective coating may be applied to the back side of the wafer.

Solder balls can then be attached to the bottom side of the converted substrate.

Typically, wafer level testing, or marking, or both are then carried out.

Singulation of the packaged wafer can then be carried out by conventional means such as sawing or cutting.

Wafer level packaging methods are known in the art, for example, see U.S. Pat. No. 5,858,815. However, one skilled in the art would recognize that the method of this invention is not limited to use in wafer level packaging may be used in other packaging methods, such as chip level packaging, as well.

In an alternative embodiment of this invention, the method can be used to make micro devices. One such micro device is a bonded composite wherein the polymeric material can be, for example, cured silicone and a substrate can be, for example, cured silicone, other materials, and combinations thereof. These composites can have various forms including laminates or three-dimensional (3-D) objects. In one embodiment, a composite structure comprising a cured silicone as a polymeric material and a solid material as a substrate is prepared, wherein only a part of the surface of the solid material is coated with the cured silicone, and the surroundings are not stained with a low molecular weight organopolysiloxane. The 3-D objects can have added functionality like thermal or electrical transfer by means of adding special fillers. The method may be used as to pretreat components of composites prior to or during assembly or to create fiber interphase adhesion, such as for optical fibers. The thin bondline created by plasma treatment should allow adhesion and electrical and thermal conductivity.

In an alternative embodiment of the invention, the method can be used in optoelectronics and photonics applications. The method will adhere optical components with low reflective losses. The optical components can comprise a wide range of materials, the majority of which have low optical transmission losses. Optical materials include silicone elastomers, silica optical fibers, silicone gels, silicone resin lenses, silicon, and others. These materials can be used in photonics devices, such as telecommunications systems. The method provides the ability to adhere a range of materials in situ, and with low reflective losses. Such plasma adhered interfaces may be less prone to thermally induced stresses, leading to improved reliability during temperature cycling (i.e., reduced stress build up and de-lamination). Plasma treatment can provide a uniform bond over complex surfaces. The method could also be used to improve light efficiency in Flat Panel Displays (bonding of color filter assembly). The method of this invention is advantageous in these applications because it avoids the need for adhesives, which may introduce a separate refractive index, introduce reflective interfaces, and increased absorption.

In an alternative embodiment of the invention, the polymeric material is a cured silicone elastomer that can be made transparent to light. The plasma treatment not only creates adhesion between the cured silicone elastomer and the substrate, but also creates an interface region between the cured silicone elastomer and the substrate that is transparent to light. This may result in low loss of light energy in a wide range of wavelengths. This embodiment is useful in optoelectronics communication and transducer devices. Without wishing to be bound by theory, it is thought that the interface will have a different refractive index than the bulk of the cured silicone elastomer. In some instances, the adhesive interface region or bond line created by the plasma treatment is about 10 to about 100 nanometers thick. This range of thickness is less than the wavelength of light useful in optoelectronics applications. Without wishing to be bound by theory, it is thought that the interface can be functionalized or plasma modified to have designed refractive indices useful in optoelectronics applications.

In an alternative embodiment of the invention, the method described above is useful in the health care industry. The polymeric material used in this embodiment is a cured silicone. The resulting plasma treated cured silicone has adherent properties that can be applied to various adherends in various products for medical applications. The plasma treatment provides biological surface cleaning.

EXAMPLES

These examples are intended to illustrate the invention to one skilled in the art and should not be interpreted as limiting the scope of the invention set forth in the claims.

Reference Example 1

Low Pressure Glow Discharge Plasma (LPGD)

A Branson/IPC Plasma Unit generates a low pressure (0.05 to 3.0 torr), radio frequency (RF) cold plasma. This unit operates either with or without continuous gas flow into the reactor throughout the capacitatively coupled plasma treatment process. The system has a control unit, plasma chamber (24,500 cubic centimeters) with quartz grid shelf, RF generator (operates at 13.56 megahertz with output power in the range of 0–500 watts with continuous control), and a vacuum pump. The chamber diameter is 25 centimeters. The chamber length is 50 centimeters. The system has model #: IPC54005-11020ST, comprising PM119 RF Generator, PM11020 Reactor Center, and PM4000C Controller. This unit is commercially available from Branson International Plasma Corporation, 31172 Huntwood Avenue, P.O. Box 4136, Hayward, Calif. 94544.

Reference Example 2

Low Pressure Glow Discharge Plasma (LPGD)

A Harrick PDC-32G Plasma Cleaner generates a low pressure, radio frequency cold plasma. This cleaner operates either with or without continuous gas flow into the reactor throughout the inductively coupled plasma treatment process. The system has a cylindrical plasma chamber (800 cubic centimeters), radio frequency (RF) generator (operates between 8 to 12 megahertz with output power at three settings of 40, 60 and 100 watts), and a vacuum pump. The chamber diameter is 7.5 centimeters. The chamber length is 18 centimeters.

Reference Example 3

Atmospheric Pressure Glow Discharge (APGD) Plasma

An Atmospheric Pressure Glow Discharge (APGD) Plasma unit operates at atmospheric or near atmospheric pressure is used to treat the surfaces. Plasmas are generated at a base pressure of 1020 millibar from He, He/$O_2$ (99%/1%) and He/$N_2$ (99%/1%) gases. The treatments are carried out with various treatment times of 1 second to 8 minutes. The inter-electrode gap is selected between 6 to 10 millimeters depending on the thickness of the substrates.

Reference Example 4

Stud Die Pull Test

A Stud (Die) Pull Test is performed by adhering a flat head screw (#1032-1¼ thread) to the top surface of the die, threading the screw into the stud which attaches to the analyzer, and pulling on the stud until failure occurs. When preparing the sample, note that if adhesive 'flows' over the top edge of the die, the sample is unusable for testing due to direct adhesion of the screw to the substrate. The flat head screws are washed with toluene/acetone to rid of oils that may prevent adhesion of the screw to the die. Bondini™(*) (Everything Gel) household super glue is used for this purpose.

Reference Example 5

Die Shear Strength Test

A Die Shear Test is performed by placing the shear tool (Royce 552®) against the edge of the die, and the force required to shear the die from the adherend is recorded. Note that the size of the sample (polyimide (PI) sheet which the die is attached) is adjusted (cut) to span across the sample holder framework (10 millimeters by 10 millimeters) to be properly secured. A ROYCE 552® Die Shear Tester is a precision universal strength testing system for evaluating microelectronic structures that measures die bond strength by performing a shear test on the die.

Reference Example 6

Modified JKR Test

The concept of using a hemispherical silicone lens and flat adherend system based on the Johnson Kendall Roberts (JKR) study is used to measure the adhesive strength of adhesion imparted by a plasma treatment. A high elastic modulus silicone lens (SYLGARD® 184 commercially available from Dow Corning Corporation of Midland, Mich.) and the adherend are plasma treated in a selected gaseous atmosphere. The treated lens and adherend are brought together into intimate contact under load. The lens tends to recover its original shape and thus exerts stress on the circular bond line. At equilibrium a finite circular area of contact between the lens and the adherend is obtained and leads to the energy of fracture expressed in Joules per square meter.

Reference Example 7

Stock Materials

Material A is a curable silicone elastomer composition having a modulus of 0.30 megaPascal after cure. The modulus is a secant modulus at 100% strain using a dumbbell-shaped specimen measured by Instron's universal tester at a cross-head speed 20 inches per minute as described in ASTM D638.

Material B is a curable silicone elastomer composition having a secant modulus at 100% strain of 0.36 megaPascal after cure. The secant modulus is measured by the same method as for Material A.

Comparative Example 1

A simplified test vehicle (TV-46) IC chip without a passivation layer has dimensions 7.4 millimeters by 5.3 millimeters.

A chip scale spacer is printed on the 1 milli-inch thick Upilex S-25 polyimide sheet using a 4 milli-inch thickness stencil with 18 milli-inch diameter apertures. Modulus of the chip scale spacer is 5 megaPascals measured by ASTM D638.

A pitch of the array of apertures is 0.75 millimeters. The resulting printed nubbins are cured at 150° C. for 30 minutes. A die attach adhesive is printed on top of the cured spacer using a 5 milli-inch thickness stencil with 16 milli-inch diameter apertures. Modulus of the die attach adhesive is 5 megaPascals measured by ASTM D638.

Example 1

Material A is drawn at thickness of five milli-inch on a Upilex 25S polyimide (PI) sheet and cured at 150° C. for 30 min. Air is used as a plasma gas, treatment time is 70 seconds, pressure is 0.78 torr, RF power is 187.5 Watts, and RF frequency is 13.56 megahertz using a large Branson/IPC plasma. Both the adhesive pad and TV-46 are treated by the plasma.

The products of Example 1 and Comparative Example 1 are evaluated according to the method of Reference Example 5. the results are in Table 1.

TABLE 1

|  | Material | Die shear strength (Kg-force) |
| --- | --- | --- |
| Comparative Example 1 | wet-based process | 3.0 |
| Example 1 | Material A | >10(*) |

(*)The PI sheet failed, not the adhesion.

Example 2 and Comparative Examples 2–4

A 10 mil film of Material A is printed on polyimide Upilex 25S and is cured at 150° C. for 30 minutes to form a silicone pad. A surface of TV-46 silicon die and the silicone pad are treated by air plasma conditions of 0.05 torr, 100 watts, and 30 second treatment time using the Branson Plasma chamber. The treated die and pad are put into intimate contact for adhesion bonding. The resulting products are described in Table 2 and are evaluated by the method of Reference Example 4. The results are in Table 2.

TABLE 2

|  |  | Die Pull Strength (grams-force) |
| --- | --- | --- |
| Comparative Example 2 | Plasma treating silicone pad only | 152 |
| Comparative Example 3 | Plasma treating TV-46 only | 34 |
| Comparative Example 4 | No plasma treatment | Die falls off pad |
| Example 2 | Treating both TV-46 and silicone pad | >1000 |

Example 2 and Comparative Examples 2–4 show a synergistic effect in that much stronger adhesion is created by plasma treatment of both the polymeric material and the adherend, rather than plasma treatment of only one of the two, in this test protocol.

Examples 3–36

Material A is drawn at thickness of five milli-inch on a one milli-inch Upilex 25S polyimide sheet and is cured at 150° C. for 30 minutes to form a silicone pad. A surface of TV-46 silicon die and the silicone pad are plasma treated. Examples 3–36 are carried out with various plasma process conditions, i.e., varying treatment pressure, treatment time, and RF power using air or oxygen using a Branson plasma chamber. The samples are tested according to Reference Example 5. The conditions are in Table 3.

TABLE 3

| EXAMPLES | GAS | Pressure(torr) | Time(second) | RF Power (Watts) |
|---|---|---|---|---|
| 3 | Air | 1.5 | 70 | 75 |
| 4 | Air | 0.05 | 20 | 187.5 |
| 5 | Air | 1.5 | 120 | 187.5 |
| 6 | Air | 0.78 | 20 | 75 |
| 7 | Air | 0.78 | 120 | 300 |
| 8 | Air | 0.78 | 120 | 75 |
| 9 | Air | 1.5 | 70 | 300 |
| 10 | Air | 0.05 | 70 | 75 |
| 11 | Air | 0.05 | 70 | 300 |
| 12 | Air | 0.78 | 70 | 187.5 |
| 13 | Air | 0.78 | 70 | 187.5 |
| 14 | Air | 0.05 | 120 | 187.5 |
| 15 | Air | 0.78 | 20 | 300 |
| 16 | Air | 1.5 | 20 | 187.5 |
| 17 | Air | 0.78 | 70 | 187.5 |
| 18 | Air | 0.78 | 70 | 187.5 |
| 19 | Air | 0.78 | 70 | 187.5 |
| 20 | Oxygen | 1.5 | 70 | 75 |
| 21 | Oxygen | 0.05 | 20 | 187.5 |
| 22 | Oxygen | 1.5 | 120 | 187.5 |
| 23 | Oxygen | 0.78 | 20 | 75 |
| 24 | Oxygen | 0.78 | 120 | 300 |
| 25 | Oxygen | 0.78 | 120 | 75 |
| 26 | Oxygen | 1.5 | 70 | 300 |
| 27 | Oxygen | 0.05 | 70 | 75 |
| 28 | Oxygen | 0.05 | 70 | 300 |
| 29 | Oxygen | 0.78 | 70 | 187.5 |
| 30 | Oxygen | 0.78 | 70 | 187.5 |
| 31 | Oxygen | 0.05 | 120 | 187.5 |
| 32 | Oxygen | 0.78 | 20 | 300 |
| 33 | Oxygen | 1.5 | 20 | 187.5 |
| 34 | Oxygen | 0.78 | 70 | 187.5 |
| 35 | Oxygen | 0.78 | 70 | 187.5 |
| 36 | Oxygen | 0.78 | 70 | 187.5 |

In each of Examples 3–36, the polyimide sheet failed, not the adhesion. Examples 3–36 show that a variety of plasma treatment conditions effectively create adhesion of the silicone elastomer and the die used in this method.

Reference Example 8

Bare silicon wafers and silicon wafers coated with a polyimide coating (PIX 3400-8 from HD MicroSystems) are singulated into 5 millimeter (mm) by 5 mm dies. The singulated dies are washed with deionized water at 800 pounds per square inch (psi) after dicing.

Bare silicon dies and polyimide-coated dies are attached on the silicone elastomer pads after both surfaces are treated by plasma. The plasma gas is air. Using the ROYCE 552® instrument, die shear strength is measured for 5 samples and the average is recorded. The die size is 5 mm by 5 mm and contact area of the die on the silicone pad is about 20 square millimeters.

Examples 37–40

Material B is printed on a 3 milli-inch KAPTON polyimide sheet using a 4 milli-inch thickness stencil where many a pair of 6 millimeter×13 millimeter rectangular apertures are patterned, and there is a 1.19 millimeter spacing between two apertures. A pitch of the pair of apertures is 5 millimeters. The printed pads are cured at 150° C. for 30 minutes. Both the silicone pads and bare or PI-coated dice prepared in Reference Example 8 are treated by plasma using the Harrick PDC-32G. Plasma conditions are: air as gas, 60 watts, 5 seconds treatment time, and 0.3 torr pressure. Each die is attached to the pad after the plasma treatment for 5 seconds under 1.25 kilograms at 220° C. The die bonded to the silicone pad by plasma are located in a 85° C./85% relative humidity (RH) chamber to show adhesion against moisture after 1, 2 and 3 weeks. The samples are tested by the method of Reference Example 5. The conditions and results are in Table 4.

TABLE 4

| Example | Average Weeks | Die Shear Strength (Kg-force) PI-coated | Die Shear Strength (Kg-force) Bare Si |
|---|---|---|---|
| 37 | 0 | 1.8 | 2.2 |
| 38 | 1 | 2.5 | 1.9 |
| 39 | 2 | 2.3 | 1.6 |
| 40 | 3 | 2.4 | 2.3 |

These examples show that durable adhesion (e.g., adhesion that lasts for at least several weeks without significant decrease in strength) can be created using the method of this invention in this test protocol.

Examples 41–43

The same die bonded to the pad in Example 37 is stored in the 150° C. convection oven to show effects of high temperature storage on the adhesion. The samples are tested by the method of Reference Example 5. The conditions and results are in Table 5.

TABLE 5

| Example | Weeks | Die Shear Strength (Kg-force) for PI-coated | Die Shear Strength (Kg-force) for Bare Si |
|---|---|---|---|
| 41 | 1 | 3.8 | 2.6 |
| 42 | 2 | 3.5 | 4.2 |
| 43 | 3 | 4.8 | 3.4 |

These examples show that adhesion created by the method of this invention can be maintained after storage of a device prepared as described above is stored at relatively high temperature for up to 3 weeks using this test protocol.

Examples 44–47

The same pad and dies used in Example 37 are used. To show how long plasma-activated surfaces are effective for adhesion, die attach is done after 1, 4, 8 and 24 hours after plasma treatment of the surfaces. Plasma conditions and die attach processes are the same as in Example 37. The results are in Table 6.

TABLE 6

| Example | Elapsed time (hr) | Die Shear Strength (Kg-force) with PI-coated Die | Die Shear Strength (Kg-force) with Bare Si Die |
|---|---|---|---|
| 44 | 1 | 1.8 | 2.2 |
| 45 | 4 | 1.8 | 1.8 |
| 46 | 8 | 2.0 | 1.2 |
| 47 | 24 | 1.8 | 0.5 |

These examples show that some semiconductors can be stored for at least about 24 hours after plasma treatment and before contacting with a silicone die attach material, and adhesion is still created using this test protocol.

Examples 48–71 and Comparative Examples 5–6

The PI-coated die and printed Material B as in Example 37 are used. Various plasma conditions and die attach temperatures are applied otherwise the same as in Example 37. Untreated assemblies are also tested to show effects of plasma for the strong adhesion. The conditions and results are shown in Table 7.

TABLE 7

| Examples | Plasma Type | Treatment Time (second) | Die Attach Temperature (C.) | Die Shear Strength (Kg-force) |
| --- | --- | --- | --- | --- |
| Comparative 5 | No treatment | — | 220 | 0.1(*) |
| 48 | compressed air | 5 | 220 | 3.1 |
| 49 | $O_2$ | 5 | 220 | 3.3 |
| 50 | Ar | 5 | 220 | 2.7 |
| 51 | He | 5 | 220 | 2.2 |
| 52 | $CO_2$ | 5 | 220 | 1.9 |
| 53 | $N_2$ | 5 | 220 | 2.9 |
| Comparative 6 | No Treatment | — | RT | 0.2(*) |
| 54 | comp air | 5 | RT | 1.1 |
| 55 | $O_2$ | 5 | RT | 1.5 |
| 56 | Ar | 5 | RT | 1.1 |
| 57 | He | 5 | RT | 0.3 |
| 58 | $CO_2$ | 5 | RT | 0.4 |
| 59 | $N_2$ | 5 | RT | 0.3 |
| 60 | comp air | 20 | 220 | 2.5 |
| 61 | $O_2$ | 20 | 220 | 2.5 |
| 62 | Ar | 20 | 220 | 3.4 |
| 63 | He | 20 | 220 | 3.0 |
| 64 | $CO_2$ | 20 | 220 | 3.3 |
| 65 | $N_2$ | 20 | 220 | 3.1 |
| 66 | comp air | 20 | RT | 2.1 |
| 67 | $O_2$ | 20 | RT | 1.9 |
| 68 | Ar | 20 | RT | 0.1(*) |
| 69 | He | 20 | RT | 0.3 |
| 70 | $CO_2$ | 20 | RT | 0.6 |
| 71 | $N_2$ | 20 | RT | 0.7 |

(*) die falls off the pad

Examples 48–71 show that routine experimentation may be required to optimize the plasma treatment conditions, contact conditions, or both of the method of this invention for some adherends.

Examples 72–95 and Comparative Examples 7–8

The bare silicon die and printed Material B as in Example 37 are used. Various plasma conditions and die attach temperatures are applied otherwise the same as in Example 37. Untreated assemblies are also tested to show effects of plasma for the strong adhesion. The conditions and results are shown in Table 8.

TABLE 8

| Examples | Plasma Gas Type | Treatment Time (second) | Die Attach Temperature (C.) | Die Shear Strength (Kg-force) |
| --- | --- | --- | --- | --- |
| Comparative 7 | No treatment | — | 220 | 0.1(*) |
| 72 | compressed air | 5 | 220 | 4.1 |
| 73 | $O_2$ | 5 | 220 | 3.8 |
| 74 | Ar | 5 | 220 | 4.2 |
| 75 | He | 5 | 220 | 2.9 |
| 76 | $CO_2$ | 5 | 220 | 2.4 |
| 77 | $N_2$ | 5 | 220 | 3.2 |
| Comparative 8 | No Treatment | — | RT | 0.1(*) |
| 78 | comp air | 5 | RT | 2.7 |
| 79 | $O_2$ | 5 | RT | 3.8 |
| 80 | Ar | 5 | RT | 0.8 |
| 81 | He | 5 | RT | 1.1 |
| 82 | $CO_2$ | 5 | RT | 0.5 |
| 83 | $N_2$ | 5 | RT | 0.6 |
| 84 | comp air | 20 | 220 | 4.3 |
| 85 | $O_2$ | 20 | 220 | 4.2 |
| 86 | Ar | 20 | 220 | 4.7 |
| 87 | He | 20 | 220 | 4.1 |
| 88 | $CO_2$ | 20 | 220 | 4.4 |
| 89 | $N_2$ | 20 | 220 | 4.3 |
| 90 | comp air | 20 | RT | 3.7 |
| 91 | $O_2$ | 20 | RT | 3.9 |
| 92 | Ar | 20 | RT | 3.5 |
| 93 | He | 20 | RT | 3.5 |
| 94 | $CO_2$ | 20 | RT | 4.0 |
| 95 | $N_2$ | 20 | RT | 1.0 |

(*)die falls off the pad

Examples 96–97-(APGD 1% Oxygen/Helium: adhesion)

The surfaces of both a silicone lens and a glass slide are treated by an $O_2$/He (1%/99%) plasma lit at atmospheric pressure for 30 seconds. The silicone lens and the glass slide are brought into intimate contact under a force of 2 kilograms for 60 seconds at room temperature. The contact diameter reached 6 to 8 millimeters. On releasing the load fracture naturally occurs driven by the elastic modulus of the elastomeric silicone lens to reach an equilibrium. Fracture is cohesive in the silicone phase. The diameter of the contact area between the silicone elastomer and the glass is around 4 to 6 millimeters. Fracture energy is calculated according to the modified JKR model. The results are in Table 9.

TABLE 9

| | Substrate | |
| --- | --- | --- |
| Example 97 | Glass | strong adhesion |
| Example 98 | Silicone | strong adhesion |

Examples 99–104

Three curable silicone materials with three different Young's moduli are spun on a wafer and cured. Young's modulus is about 10 megaPascals, 300 megaPascals and 1.1 gigaPascals respectively. Young's modulus is measured by ASTM D4065-95 tensile mode using Dynamic Mechanical Analyzer (DMA) made by TA Instruments. Plasma conditions are air, 5 seconds treatment time and 60 watts RF power using Harrick PDC-32G. Dies (5 mm×5 mm) are attached on the cured silicone for 5 seconds at 190° C. under 1.25 Kgf. The results are in Table 10.

Comparative Examples 9–14

Examples 99–104 are repeated except no plasma treatment is carried out. No adhesion was found without the plasma treatment.

TABLE 10

| | Young's Modulus of Silicone coating (megaPascal) | Die Surface | Adhesion |
| --- | --- | --- | --- |
| Example 99 | 10 | PI-coated | Strong |
| Example 100 | 10 | Bare Si | Strong |
| Example 101 | 300 | PI-coated | Strong |

TABLE 10-continued

|  | Young's Modulus of Silicone coating (megaPascal) | Die Surface | Adhesion |
| --- | --- | --- | --- |
| Example 102 | 300 | Bare Si | Strong |
| Example 103 | 1100 | PI-coated | Strong |
| Example 104 | 1100 | Bare Si | Strong |

Examples 99–104 show that strong adhesion can be created with polymeric materials having wide modulus ranges according to this test protocol.

Examples 105–109

Cured Material A as in Example 37 and various substrates are treated by various plasma conditions otherwise the same as in Example 99. Die attach conditions are the same as Example 99. The substrates, plasma treatment conditions, and results are in Table 11.

Comparative Examples 15–19

Examples 105–109 are repeated except no plasma treatment is carried out. No adhesion was found without the plasma treatment.

TABLE 11

|  | Substrate | Gas | Treatment time (seconds) | RF power (watts) | Adhesion |
| --- | --- | --- | --- | --- | --- |
| Example 105 | Silicon oxide passivated wafer | Air | 5 | 60 | Strong |
| Example 106 | Silicon nitride passivated wafer | Air | 5 | 60 | Strong |
| Example 107 | FR-4 board | Air | 5 | 60 | Strong |
| Example 108 | Solder Mask | Air | 5 | 60 | Strong |
| Example 109 | Plated Au on PI tape | Oxygen | 20 | 60 | Strong |

Examples 105–109 show that strong adhesion can be created using a variety of substrates using this test protocol.

Comparative Example 16

A silicone elastomer with a modulus of less than 1 megaPascal and a and flat piece of silicone resin with a modulus of 0.5–1.5 gigaPascals are plasma treated for 30 seconds using high purity compressed air as the plasma gas in a Harrick PDC-002 Plasma Cleaner at 29.6 Watts. Contact time is 1 minute under a force of 2 Kg. Fracture energy is calculated according to the modified JKR model of Reference Example 6. The results are in Table 12.

Example 110

Comparative Example 16 is repeated except that contact time is 12 hours. Die shear strength is measured according to the method of Reference Example 5. The results are in Table 12.

TABLE 12

|  | Joules per square meter |
| --- | --- |
| Comparative Example 16 | 0 |
| Example 110 | 30 |

0 means no adhesion.

Comparative Example 16 and Example 110 show that adhesion can take more time to develop using some adherends over others. Example 110 also shows that adhesion can be created with relatively high modulus resins.

We claim:
1. A method comprising:
   A) plasma treatment of a polymeric material;
   B) plasma treatment of an adherend;
   wherein steps A) and B) are carried out using a gas comprising air, argon, carbon dioxide, helium, nitrogen, nitrous oxide, ozone, or combinations thereof; and
   C) thereafter contacting the polymeric material and the adherend;
   thereby creating adhesion of the polymeric material and the adherend.

2. The method of claim 1, wherein steps A) and B) are carried out concurrently.

3. The method of claim 1, wherein steps A) and B) are carried out sequentially in any order.

4. The method of claim 1, further comprising: storing the polymeric material after step A) and before step C), or storing the adherend after step B) and before step C), or both.

5. The method of claim 1, comprising repeating steps A), B), and C) one or more times.

6. The method of claim 5, wherein steps A), B), and C) are repeated once to add a second adherend to the polymeric material.

7. The method of claim 1, wherein the polymeric material has a modulus of at least about 0.1 megaPascal.

8. The method of claim 1, wherein the polymeric material has a modulus of up to about 5 gigaPascals.

9. The method of claim 8, wherein the polymeric material has a modulus of up to about 1 gigaPascal.

10. The method of claim 9, wherein the polymeric material has a modulus of up to about 300 megaPascals.

11. The method of claim 1, wherein the polymeric material comprises a thermoset material comprising a flexibilized epoxy or an elastomer.

12. The method of claim 1, wherein the polymeric material comprises a thermoplastic material comprising a silicone-organic copolymer wax, a polyolefin, a polyimide, a phenolic, or combinations thereof.

13. The method of claim 1, wherein the polymeric material comprises a silicone, an organic, a silicone-organic copolymer, or combinations thereof.

14. The method of claim 13, wherein the organic comprises a cured organic resin, a cured organic elastomer, a cured organic polymer, or a combination thereof.

15. The method of claim 1, wherein step A) and step B) are each independently carried out using a plasma treatment selected from corona discharge treatment, dielectric barrier discharge treatment, and glow discharge treatment.

16. The method of claim 15, wherein the glow discharge treatment is carried out using plasma selected from low pressure glow discharge or atmospheric pressure glow discharge.

17. The method of claim 1, wherein step A) and step B) are each independently carried out at a pressure of up to about atmospheric pressure.

18. The method of claim 1, wherein step A) and step B) are each independently carried out for a time of at least about 1 millisecond.

19. The method of claim 1, wherein step A) and step B) are each independently carried out for a time of up to about 30 minutes.

20. The method of claim 1, wherein step C) is carried out at a temperature of at least about 15° C.

21. The method of claim 1, wherein step C) is carried out at a temperature of up to about 400° C.

22. The method of claim 1, wherein step C) is carried out by applying pressure for a time of at least about 0.1 second.

23. The method of claim 1, wherein step C) is carried out by applying pressure for a time of up to about 12 hours.

24. A method comprising:
A) plasma treatment of a polymeric material, wherein the polymeric material comprises a silicone and the silicone comprises a cured silicone resin, a cured silicone elastomer, a cured silicone rubber, or a combination thereof,
B) plasma treatment of an adherend, and
C) thereafter contacting the polymeric material and the adherend;
thereby creating adhesion of the polymeric material and the adherend;
wherein the method is carried out during fabrication of an electronic device, an electronic device package, a photonic device, or an optoelectronic device.

25. A method comprising:
A) plasma treatment of a polymeric material for up to about 30 seconds,
B) plasma treatment of an adherend for a period greater than 30 seconds and up to about 30 minutes, and
C) thereafter contacting the polymeric material and the adherend;
thereby creating adhesion of the polymeric material and the adherend.

26. A method comprising:
A) plasma treatment of a polymeric material;
B) plasma treatment of a substrate, wherein the substrate comprises a ceramic selected from aluminum nitride, aluminum oxide, silicon carbide, silicon oxynitride, and combinations thereof; and
C) thereafter contacting the polymeric material and the substrate;
thereby creating adhesion of the polymeric material and the substrate.

27. A method comprising:
a) plasma treatment of a polymeric material,
b) plasma treatment of a substrate,
c) plasma treatment of a semiconductor,
d) contacting the polymeric material and the substrate, and
e) contacting the semiconductor and the polymeric material;
thereby creating adhesion of the substrate and the polymeric material, and the polymeric material and the semiconductor.

28. The method of claim 27, wherein steps a), b), c), d), and e) are carried out in an order selected from: abcde, acbde, abced, acbed, bacde, baced, bcade, bcaed, cabde, cabed, cbade, cbaed, abdce, badce, acebd, caebd, abdace, badace, abdcae, badcae, aceabd, caeabd, acebad, or caebad.

29. The method of claim 27, wherein steps a), b) and c) are carried out concurrently, and thereafter steps d) and e) are carried out in any order.

30. The method of claim 27, wherein steps a), b) and c) are carried out in any order, and thereafter steps d) and e) are carried out concurrently.

31. The method of claim 27, wherein steps a), b), and c) are carried out concurrently, and thereafter steps d) and e) are carried out concurrently.

* * * * *